United States Patent
Platzgummer et al.

(10) Patent No.: US 10,840,054 B2
(45) Date of Patent: Nov. 17, 2020

(54) CHARGED-PARTICLE SOURCE AND METHOD FOR CLEANING A CHARGED-PARTICLE SOURCE USING BACK-SPUTTERING

(71) Applicant: IMS Nanofabrication GmbH, Vienna (AT)

(72) Inventors: Elmar Platzgummer, Vienna (AT); Mattia Capriotti, Vienna (AT); Christoph Spengler, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 0 days.

(21) Appl. No.: 16/259,827

(22) Filed: Jan. 28, 2019

(65) Prior Publication Data
US 2019/0237288 A1   Aug. 1, 2019

Related U.S. Application Data

(60) Provisional application No. 62/623,952, filed on Jan. 30, 2018.

(51) Int. Cl.
*H01J 37/063*   (2006.01)
*H01J 37/305*   (2006.01)
(Continued)

(52) U.S. Cl.
CPC .......... *H01J 37/063* (2013.01); *H01J 37/065* (2013.01); *H01J 37/1477* (2013.01);
(Continued)

(58) Field of Classification Search
CPC .. H01J 37/00; H01J 37/02; H01J 37/06; H01J 37/063; H01J 37/073; H01J 37/26; H01J 37/261
(Continued)

(56) References Cited

U.S. PATENT DOCUMENTS 1,033,741 A   7/1912   Sims
1,420,104 A   6/1922   Howe et al.
(Continued)

FOREIGN PATENT DOCUMENTS

CN   202204836 U   4/2012
EP   0178156 A2   4/1986
(Continued)

OTHER PUBLICATIONS

European Search Report for Application 08450077.6, report dated Jan. 29, 2010, 2 pgs.
(Continued)

*Primary Examiner* — Jason L McCormack
(74) *Attorney, Agent, or Firm* — KPPB LLP

(57) ABSTRACT

A charged-particle source for emission of electrons or other electrically charged particles comprises, located between the emitter electrode having an emitter surface and a counter electrode, at least two adjustment electrodes; a pressure regulator device is configured to control the gas pressure in the source space at a pre-defined pressure value. In a first cleaning mode of the particle source, applying a voltage between the emitter and counter electrodes directs gas particles towards the counter electrode, generating secondary electrons which ionize particles of the gas in the source space, and electrostatic potentials are applied to at least some of the adjustment electrodes, generating an electric field directing the ionized gas particles onto the emitter surface.

22 Claims, 9 Drawing Sheets

(51) Int. Cl.
*H01J 37/147* (2006.01)
*H01J 37/30* (2006.01)
*H01J 37/065* (2006.01)

(52) U.S. Cl.
CPC ...... *H01J 37/3007* (2013.01); *H01J 37/3056* (2013.01); *H01J 2237/06375* (2013.01)

(58) Field of Classification Search
USPC .............................. 250/306, 307, 311, 396 R
See application file for complete search history.

(56) References Cited

U.S. PATENT DOCUMENTS

| | | | |
|---|---|---|---|
| 1,903,005 A | 3/1933 | McCuen | |
| 2,187,427 A | 1/1940 | Middleton | |
| 2,820,109 A | 1/1958 | Dewitz | |
| 2,920,104 A | 1/1960 | Brooks et al. | |
| 3,949,265 A | 4/1976 | Holl | |
| 4,467,211 A | 8/1984 | Smith | |
| 4,735,881 A | 4/1988 | Kobayashi et al. | |
| 4,899,060 A | 2/1990 | Lischke | |
| 5,103,101 A | 4/1992 | Neil et al. | |
| 5,189,306 A | 2/1993 | Frei | |
| 5,260,579 A | 11/1993 | Yasuda et al. | |
| 5,369,282 A | 11/1994 | Arai et al. | |
| 5,393,987 A | 2/1995 | Abboud et al. | |
| 5,399,872 A | 3/1995 | Yasuda et al. | |
| 5,533,170 A | 7/1996 | Teitzel et al. | |
| 5,814,423 A | 9/1998 | Maruyama et al. | |
| 5,841,145 A | 11/1998 | Satoh et al. | |
| 5,847,959 A | 12/1998 | Veneklasen et al. | |
| 5,857,815 A | 1/1999 | Bailey et al. | |
| 5,866,300 A | 2/1999 | Satoh et al. | |
| 5,876,902 A | 3/1999 | Veneklasen | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,107,636 A | 8/2000 | Muraki | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 | 5/2001 | McKinley et al. | |
| 6,252,339 B1 | 6/2001 | Kendall | |
| 6,258,511 B1 | 7/2001 | Okino et al. | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki et al. | |
| 6,617,587 B2 | 9/2003 | Parker | |
| 6,768,123 B2 | 7/2004 | Giering | |
| 6,768,125 B2 | 7/2004 | Platzgummer et al. | |
| 6,829,054 B2 | 12/2004 | Stanke et al. | |
| 6,835,937 B1 | 12/2004 | Muraki et al. | |
| 6,858,118 B2 | 2/2005 | Platzgummer et al. | |
| 6,897,454 B2 | 5/2005 | Sasaki et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson | |
| 7,214,951 B2 | 5/2007 | Stengl et al. | |
| 7,276,714 B2 | 10/2007 | Platzgummer et al. | |
| 7,368,738 B2 | 5/2008 | Platzgummer et al. | |
| 7,446,601 B2 | 11/2008 | LeChevalier | |
| 7,459,247 B2 | 12/2008 | Bijnen et al. | |
| 7,671,687 B2 | 3/2010 | LeChevalier | |
| 7,683,551 B2 | 3/2010 | Miyamoto et al. | |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,741,620 B2 | 6/2010 | Doering et al. | |
| 7,772,574 B2 | 8/2010 | Stengl et al. | |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Heinrich et al. | |
| 8,115,183 B2 | 2/2012 | Platzgummer et al. | |
| 8,178,856 B2 | 5/2012 | Nakayamada et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2 | 9/2012 | Sczyrba et al. | |
| 8,258,488 B2 | 9/2012 | Platzgummer et al. | |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2 | 8/2013 | Wieland | |
| 8,531,648 B2 | 9/2013 | Jager et al. | |
| 8,546,767 B2 | 10/2013 | Platzgummer et al. | |
| 8,563,942 B2 | 10/2013 | Platzgummer | |
| 8,598,544 B2 | 12/2013 | Van De Peut et al. | |
| 8,736,170 B1 | 5/2014 | Liu et al. | |
| 8,859,983 B2 | 10/2014 | Wieland | |
| 9,053,906 B2 | 6/2015 | Platzgummer | |
| 9,093,201 B2 | 7/2015 | Platzgummer et al. | |
| 9,099,277 B2 | 8/2015 | Platzgummer | |
| 9,184,026 B2 | 11/2015 | Wieland | |
| 9,188,874 B1 | 11/2015 | Johnson | |
| 9,269,543 B2 | 2/2016 | Reiter et al. | |
| 9,335,638 B2 | 5/2016 | Jager et al. | |
| 9,373,482 B2 | 6/2016 | Platzgummer | |
| 9,443,699 B2 | 9/2016 | Platzgummer et al. | |
| 9,495,499 B2 | 11/2016 | Platzgummer et al. | |
| 9,520,268 B2 | 12/2016 | Platzgummer | |
| 9,568,907 B2 | 2/2017 | Platzgummer et al. | |
| 9,653,263 B2 | 5/2017 | Platzgummer et al. | |
| 9,691,589 B2 | 6/2017 | Van De Peut et al. | |
| 9,799,487 B2 | 10/2017 | Platzgummer | |
| 9,978,562 B2 | 5/2018 | Van De Peut et al. | |
| 10,325,756 B2 | 6/2019 | Platzgummer | |
| 10,325,757 B2 | 6/2019 | Platzgummer et al. | |
| 10,410,831 B2 | 9/2019 | Platzgummer | |
| 10,522,329 B2 | 12/2019 | Platzgummer et al. | |
| 2001/0028038 A1 | 10/2001 | Hamaguchi et al. | |
| 2002/0021426 A1 | 2/2002 | Mei et al. | |
| 2002/0036264 A1* | 3/2002 | Nakasuji | G01N 23/225 250/306 |
| 2002/0148978 A1 | 10/2002 | Innes et al. | |
| 2003/0085360 A1 | 5/2003 | Parker et al. | |
| 2003/0106230 A1 | 6/2003 | Hennessey | |
| 2003/0155534 A1 | 8/2003 | Platzgummer et al. | |
| 2003/0160980 A1 | 8/2003 | Olsson et al. | |
| 2004/0056207 A1* | 3/2004 | Petrov | H01J 37/1475 250/396 ML |
| 2004/0058536 A1 | 3/2004 | Ki | |
| 2004/0119021 A1 | 6/2004 | Parker et al. | |
| 2004/0157407 A1 | 8/2004 | Qin-Yi et al. | |
| 2004/0169147 A1 | 9/2004 | Haruhito et al. | |
| 2005/0001178 A1 | 1/2005 | Parker et al. | |
| 2005/0063510 A1 | 3/2005 | Hieronimi et al. | |
| 2005/0072941 A1 | 4/2005 | Tanimoto et al. | |
| 2005/0104013 A1 | 5/2005 | Stengl et al. | |
| 2005/0242302 A1 | 11/2005 | Platzgummer et al. | |
| 2005/0242303 A1 | 11/2005 | Platzgummer | |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans et al. | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1 | 6/2008 | Doering et al. | |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0212052 A1 | 9/2008 | Wagner et al. | |
| 2008/0237460 A1 | 10/2008 | Fragner et al. | |

(56) References Cited

U.S. PATENT DOCUMENTS

| | | |
|---|---|---|
| 2008/0257096 A1 | 10/2008 | Zhu et al. |
| 2008/0260283 A1 | 10/2008 | Ivansen |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0084219 A1* | 4/2011 | Adamec ............. H01J 37/06 250/492.1 |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0161511 A1* | 6/2013 | Karimata ............. H01J 37/28 250/307 |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0158916 A1 | 6/2014 | Fujimura |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0284509 A1 | 9/2016 | Matsumoto |
| 2016/0336147 A1 | 11/2016 | Platzgummer |
| 2016/0349626 A1 | 12/2016 | Matsumoto |
| 2017/0032926 A1* | 2/2017 | Miyamoto .......... H01J 37/3174 |
| 2017/0154750 A1* | 6/2017 | Sato ..................... H01J 37/065 |
| 2017/0357153 A1 | 12/2017 | Platzgummer |
| 2018/0019094 A1* | 1/2018 | Iwata .................. H01J 37/073 |
| 2018/0218879 A1 | 8/2018 | Platzgummer et al. |
| 2019/0066976 A1 | 2/2019 | Platzgummer et al. |
| 2019/0088448 A1 | 3/2019 | Platzgummer et al. |
| 2019/0214226 A1 | 7/2019 | Platzgummer et al. |

FOREIGN PATENT DOCUMENTS

| | | |
|---|---|---|
| EP | 0928012 A2 | 7/1999 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2190003 A2 | 5/2010 |
| EP | 2214194 A1 | 8/2010 |
| EP | 2312609 A1 | 4/2011 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| GB | 2349737 A | 11/2000 |
| JP | 08213301 A | 8/1996 |
| JP | 2006019436 A | 1/2006 |
| JP | 2006332289 | 12/2006 |
| JP | 2007172862 A | 7/2007 |
| JP | 2010098275 A | 4/2010 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for Application 09450211.9-1226; report dated Sep. 14, 2010; 4 pgs.

European Search Report for application 09450212.7; dated Sep. 28, 2010, 9 pgs.

European Search Report for Application 141501197.7, report dated Jun. 6, 2014, 2 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851; report dated Oct. 16, 2014; 1 page.

European Search Report for Application 14199183, report dated Jun. 19, 2015, 2 pgs.

European Search Report for Application 15159397.7, report dated Sep. 28, 2015, 7 pgs.

European Search Report for Application 15159617.8, report dated Oct. 19, 2015, 3 pgs.

European Search Report for Application 15164770, report dated Sep. 18, 2015; 2 pgs.

European Search Report for Application 15164772, report dated Sep. 11, 2015, 2 pgs.

European Search Report for Application 15169632, report dated Oct. 20, 2015, 3 pgs.

European Search Report for Application 15171348, report dated Oct. 30, 2015, 2 pgs.

European Search Report for EP 14176645, completed Dec. 1, 2014, 1 pg.

European Search Report for EP Application No. 16174185, Search Completed Dec. 6, 2016, 2 pgs.

European Search Report for European Application 10450070.7 dated May 7, 2012, 13 pgs.

European Search Report for European Application No. 16160622, Search completed Jul. 21, 2016, dated Jul. 21, 2016, 3 pgs.

European Search Report for European Patent Application 16160621, Report Completed Oct. 5, 2016, 3 pgs.

Extended European Search Report for European Application No. 16169216.5, Search completed Sep. 21, 2016, dated Sep. 29, 2016, 12 Pgs.

(56) References Cited

OTHER PUBLICATIONS

Extended European Search Report for European Application No. 17153506, Search completed Oct. 5, 2017, dated Oct. 16, 2017, 2 pgs.

Extended European Search Report for European Application No. 17187922.4, Search completed Feb. 21, 2018, dated Mar. 6, 2018, 7 pgs.

Extended European Search Report for European Application No. 17191553.1, Search completed Mar. 22, 2018, dated Apr. 9, 2018, 5 pgs.

Extended European Search Report for European Application No. 18150797.1, Search completed Jun. 29, 2018, dated Jul. 9, 2018, 8 pgs.

Extended European Search Report for European Application No. 18154140.0, Search completed Aug. 16, 2018, dated Sep. 4, 2018, 5 pgs.

"Dither", Wikipedia, Retrieved from https://en.wikipedia.org/w/index.php?title=Dither&oldid=762118152 on Oct. 5, 2017.

"Ordered dithering", Wikipedia, Retrieved from https://en.wikipedia.org/w/index.php?title=Ordered_dithering&oldid=759840417 on Oct. 5, 2017.

Berry et al., "Programmable aperture plate for maskless high-throughput nanolithography", J. Vac. Sci. Technol., Nov./Dec. 1997, vol. B15, No. 6, pp. 2382-2386.

Borodovsky, "EUV, EBDW—ARF Replacement or Extension?", KLA-Tencor Lithography User Forum, Feb. 21, 2010, San Jose, CA, USA, 21 pgs.

Borodovsky, "MPProcessing for MPProcessors", SEMATECH Maskless Lithography and Multibeam Mask Writer Workshop, May 10, 2010, New York, NY, USA, 35 pgs.

Disclosed Anonymously, "Multi-tone rasterization, dual pass scan, data path and cell based vector format", IPCOM000183472D, printed from ip.com PriorArtDatabase, published May 22, 2009, 108 pages.

Hinterberger, "Ion optics with electrostatic lenses", University of Bonn, Germany, 2006, 18 pgs.

Huber et al., "Computing Straight Skeletons and Motorcycle Graphs: Theory and Practice", Thesis, Univ. of Salzburg (Austria) Jun. 2011, 134 pgs.

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8.

Kim et al., "Binary-encounter-dipole model for electron-impact ionization", Physical Review A, Nov. 1994, vol. 50, No. 3, pp. 3954-3967.

Li et al., "Through-Silicon Interposer Technology for Heterogeneous Integration", Future Fab Intl., Issue 45 (Apr. 25, 2013), 6 pgs.

Palfrader et al., "Computing Mitered Offset Curves Based on Straight Skeletons", Computer-Aided Design & Applications, vol. 12, No. 4, Feb. 11, 2015, pp. 414-424.

Paraskevopoulos et al., "Scalable (24-140 Gbps) optical data link, well adapted for future maskless lithography applications", Proc. SPIE vol. 7271, 72711 I (2009), 11 pgs.

Platzgummer et al., "eMET—50keV electron Mask Exposure Tool Development based on proven multi-beam projection technology", Proc. of SPIE, 2010, vol. 7823, pp. 782308-1-782308-12.

Platzgummer et al., "eMET POC: Realization of a proof-of-concept 50 keV electron multibeam Mask Exposure Tool", Proc. of SPIE, 2011, vol. 8166, pp. 816622-1-816622-7.

Shih, "Image processing and mathematical morphology: fundamentals and applications", CRC Press, 2009, pp. 26-32.

Vink et al., "Materials with a high secondary-electron yield for use in plasma displays", Applied Physics Letters, Mar. 25, 2002, vol. 80, No. 12, pp. 2216-2218.

Wheeler et al., "Use of Electron Beams in VLSI", G.E.C. Journal of Science and Technology, General Electric Company. Wembley, Middlesex, GB, vol. 48, No. 2, Jan. 1, 1982, pp. 103-107, XP000820522.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

\* cited by examiner

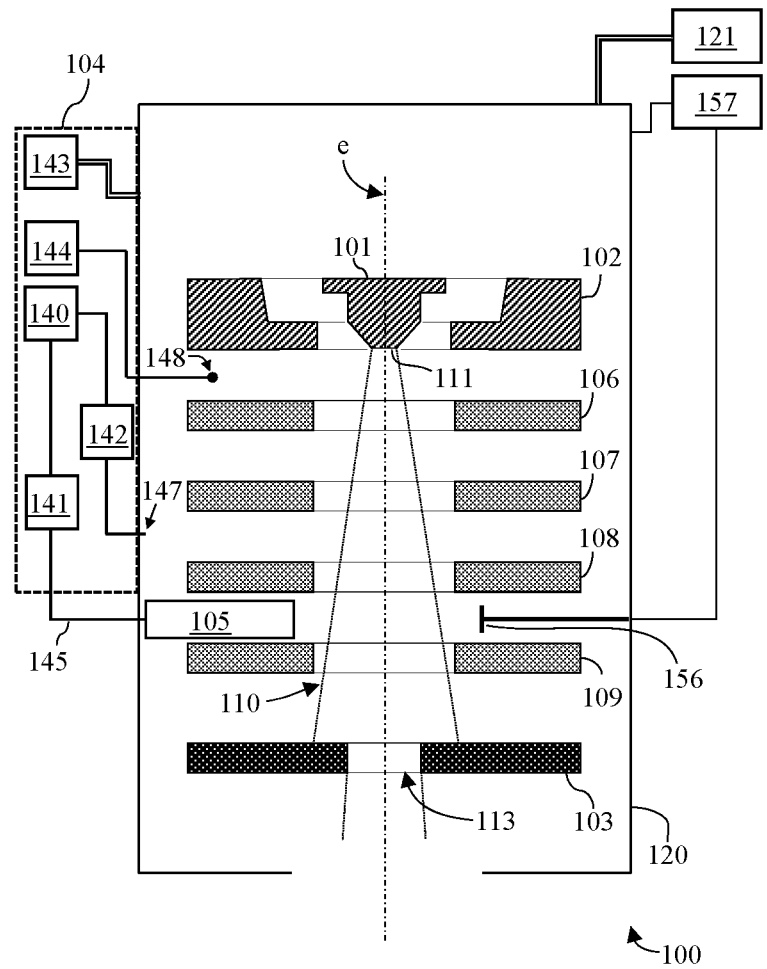
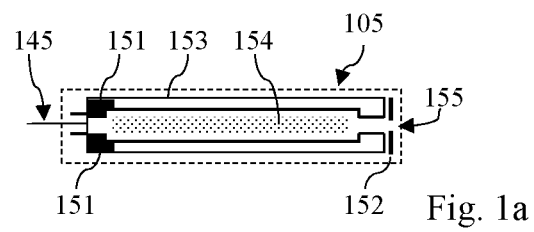
Fig. 1
Fig. 1a

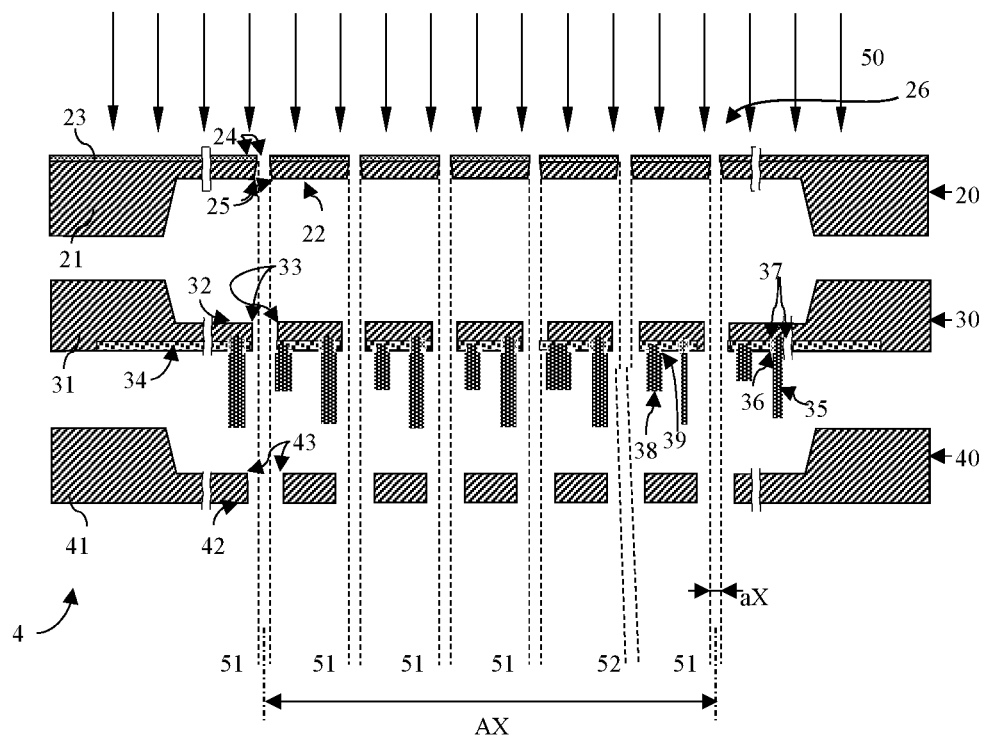
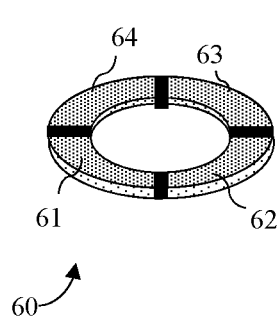
Fig. 4a
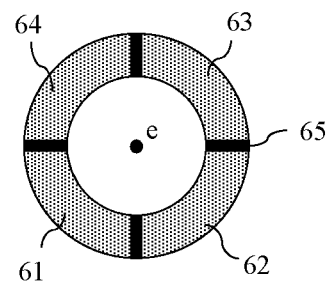
Fig. 4b

US 10,840,054 B2

CHARGED-PARTICLE SOURCE AND METHOD FOR CLEANING A CHARGED-PARTICLE SOURCE USING BACK-SPUTTERING

CROSS REFERENCE TO RELATED APPLICATIONS

This application claims priority to U.S. Provisional Application No. 62/623,952, entitled "Charged-Particle Source and Method For Cleaning a Charged-Particle Source Using Back-Sputtering" to Platzgummer et al., filed Jan. 30, 2018, the disclosure of which is incorporated by reference herein in its entirety.

FIELD OF THE INVENTION

The present invention relates to a charged-particle source which is suitable for use in, or as part of charged-particle nano-pattering or inspection tools, in particular of the multi-beam type. More specifically, the invention relates to a source for emission of electrically charged particles, in particular electrons, as a charged-particle beam along a direction of emission, with the charged-particle source comprising
  a housing connectable to a vacuum system, allowing the charged-particle source being operated at a high vacuum,
  an emitter electrode (i.e., an emitter anode or cathode, depending on whether the charged particles carry positive or negative electric charge, respectively), which emitter electrode has an emitter surface configured to emit charged particles of a specific particle species (such as electrons, but alternatively also ions are possible, in particular ions carrying a positive electric charge) along the direction of emission,
  a counter electrode configured to being applied an electrostatic voltage with respect to the emitter electrode at a sign opposite to that of the electrically charged particles, the counter electrode having an emitter aperture at a location downstream of the emitter surface along said direction of emission, and
  a space defined between the emitter surface and the emitter aperture, which space is referred to as source space.

BACKGROUND OF THE INVENTION

Charged particle sources are used, for instance, as sources to generate a particle beam in a charged-particle multi-beam tool for nano-pattering or inspecting semiconductor substrates. FIG. 2 shows a schematic view of a typical multi-beam writer and its main components 2. Lithographic apparatuses of this type are well known in prior art, such as U.S. Pat. No. 6,768,125, EP 2 187 427 A1 (=U.S. Pat. No. 8,222,621) and EP 2 363 875 A1 (=U.S. Pat. No. 8,378,320) of the applicant. In the following, only those details are given as needed to disclose certain embodiments of the invention such that one of ordinary skill in the art can practice the various embodiments of the invention; for the sake of clarity, the components are not shown to size in FIG. 2. The main components of the lithography apparatus 1 are—corresponding to the direction of the lithography beam 50, 50b which in this example runs vertically downward in FIG. 2—an illumination system 3, a pattern definition (PD) system 4, a projecting system 5, and a target station 6 with the substrate 16. The whole apparatus 1 is contained in a vacuum housing 2 and generally, but not exclusively, held at high vacuum to ensure an unimpeded propagation of the beam 50, 50b along the optical axis cx of the apparatus. The term 'high vacuum' is used herein to denote a vacuum at a pressure below $0.1 \cdot 10^{-3}$ Pa. It has to be underlined that, although the housing 2 is kept at high vacuum, residual gas particles remain and consequently they weakly interact with the beam 50, 50b and/or with the apparatus 1 components. The charged-particle optical systems 3, 5 are realized using electrostatic and/or magnetic lenses.

The illumination system 3 comprises, for instance, the electron source as the one subject of this invention 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are generally, but not exclusively, formed into a wide particle beam serving as lithography beam 50. The lithography beam 50 then irradiates a PD system 4 which comprises a number of plates with a plurality of openings or apertures 24 (FIG. 3). The PD system 4 is held at a specific position in the path of the lithography beam 50, which thus irradiates the plurality of apertures and is split up into a number of beamlets.

Referring to FIG. 3, some of the apertures 26 of the PD system 4 are "switched on" or "open" so as to be transparent to the incident beam in the sense that they allow the portion of the beam (beamlets 51) that is transmitted through it to reach the target; the other apertures are "switched off" or "closed", i.e. the corresponding beamlets 52 cannot reach the target, and thus effectively these apertures and/or openings are non-transparent (opaque) to the beam. Thus, the lithography beam 50 is structured into a patterned beam 50b (composed of beamlets 51 and 52), emerging from the PD system 4. The pattern of switched on apertures—the only portions of the PD system 4 which are transparent to the lithography beam 50—is chosen according to a pattern which is to be exposed on the target 16. It has to be noted that the "switching on/off" of the beamlets usually is realized by some sort of deflection means provided in one of the plates of the PD system 4: "Switched off"-beamlets are deflected off their path (by very small angles) so they cannot reach the target but are merely absorbed somewhere in the lithography apparatus, e.g. by an absorbing plate (or, equivalently termed "stopping aperture plate") 11. Further details about structure and function of the PD system 4 (FIG. 3) can be found in U.S. Pat. Nos. 9,653,263 and 9,799,487 of the applicant, which documents are herewith included by reference.

The pattern as represented by the patterned beam 50b is then projected by means of an electro-magneto-optical projection system 5 onto the substrate 16 where it forms an image of the "switched-on" apertures and/or openings. The projection system 5 comprises a number of consecutive electro-magneto-optical lens components 10a, 10b, 10c and implements a demagnification of, for instance, 200:1 with two crossovers c1 and c2. Furthermore, deflection means 12a, 12b and 12c may be provided in the condenser 3 and/or projection system 5 for lateral shifting the image. The target or "substrate" 16 is, for instance, a 6" mask blank or a silicon wafer covered with a particle sensitive resist layer 17. The substrate is held by a chuck 15 and positioned by a substrate stage 14 of the target station 6.

The operation of lithography apparatus such as the apparatus 1 and related processing and writing methods are discussed, e.g., in U.S. Pat. No. 9,053,906 of the applicant as well as the mentioned documents U.S. Pat. Nos. 6,768, 125, 8,222,621 and 8,378,320 of the applicant; the disclosure of these documents is herewith included by reference.

The dose rate of each beamlet reaching the resist layer 17 is ultimately linked to the local current density of the lithography beam generated by the charged particle source, which is basically a radial function of the distance from the optical axis; but in general, the current density may also exhibit position-dependent components which arise from source emission inhomogeneity. The latter is determined by factors such as: contaminations on the cathode surface, residual gasses present in the housing 2 and many others. It will be clear to the skilled person that removal of contaminants from the source cathode surface is of crucial importance for efficiency and long term reliability of the apparatus.

It is common practice to remove contaminants from a surface by a cleaning process which employs slightly eroding the surface by means of sputtering or etching (including, in particular, chemical plasma etching). However, in case of a cathode to be installed in an particle-beam processing apparatus (such as eMET), the cathode will be available to be cleaned/sputtered only before being mounted into the apparatus. Thus, the cleaning procedure as known from the state of the art would not be effective against contamination factors accumulated during mounting or during operation.

SUMMARY OF THE INVENTION

In view of the above, it is one object of this invention to provide a particle source and a method for cleaning a particle source which enables cleaning of the particle source directly in the source environment, thus providing 'in situ' cleaning of the cathode (emitter electrode) of the source without disassembling the optical system. That is, without physically removing the source body from the rest of the eMET apparatus. The cleaning mechanism is mainly envisaged to employ sputtering or etching. It is a further objective of the invention to provide a particle source and cleaning method that enables controlling the trajectories of charged particles present in the source environment.

The above-mentioned objectives are met by a charged-particle source which, in addition to the components mentioned in the beginning, comprises at least two adjustment electrodes, located surrounding the source space between the emitter electrode and the counter electrode, each adjustment electrode being configured to being applied a controlled electrostatic voltage with respect to the counter electrode or the emitter electrode (depending on which is chosen as reference point), and a pressure regulator device, said pressure regulator device being configured to control the pressure of gas in the source space, wherein the particle source is not only operable in an emission mode wherein a voltage is applied between the emitter and counter electrodes, causing generation of charged particles leaving the particle source along the direction of emission, but also in a first cleaning mode, where a gas is held at a pre-defined pressure value within the source space, while applying a voltage between the emitter and counter electrodes, wherein secondary electrons generated by charged particles at the counter electrode ionize particles of said gas fed into the source space, producing ionized gas particles, and electrostatic potentials are applied to at least some of the adjustment electrodes, generating an electric field directing these ionized gas particles onto the emitter surface. The gas present in the source space may be, for instance, gas supplied from a gas source (or a number of gas sources), possibly under control of the pressure regulator device (e.g. including MFCs or other suitable metering devices), or may be gas from the atmosphere, including residual gas.

In other words, a cleaning method which corresponds to said first cleaning mode comprises regulating the pressure of gas within the source space of the charged-particle source (as mentioned, the gas may be atmospheric gas or may be provided from some gas source, possibly fed in through the pressure regulator device), and applying a voltage between the emitter electrode and a counter electrode, wherein secondary electrons generated by charged particles at said counter electrode ionize particles of said gas in the source space, producing ionized gas particles, and applying electrostatic potentials to adjustment electrodes located between the emitter surface and the counter electrode, generating an electric field directing said ionized gas particles onto the emitter surface.

This solution offers an efficient implementation of cleaning in a charged-particle source. It also provides an efficient tool for generating, extracting and/or controlling the trajectory of the charged particles present in the source environment. The ionized gas particles are directed onto the emitter surface for removing material from the surface, for instance by sputtering (back-sputtering) and/or etching effects. In a cleaning mode, the ionization of the gas species in the source space is partially or entirely decoupled from the primary beam radiation as produced by the emitter surface. In the mentioned first cleaning mode (also referred to as 'soft cleaning mode'), the ionization is enhanced by secondary electrons emitted at the counter electrodes and possibly other components surrounding the source space (such as the adjustment electrodes discussed further below) as a consequence of being hit by the particles of the primary beam radiation.

Thus, the invention offers a larger degree of freedom concerning the parameters of operation of the source during a cleaning process, and allows to better adjust the energy of the ionizing radiation so as to achieve a desired cleaning result, the preferential location within the source space where the ionization takes place and ultimately the ionization rate of the gas species present in the source space to operating parameters suitable to achieve efficient cleaning of the emitter surface. Thus, controlling the sputtering rate at the emitter surface is improved. The ionization rate can be adjusted based on, e.g., the binary-encounter dipole model presented in the article "Binary-encounter-dipole model for electron-impact ionization" of Y.-K. Kim & M. E. Rudd, Phys. Rev. A 50, 3954 (1994). The source setup of the invention allows an improved control of trajectories of the charged particle present in the source space, including those species which are unintentionally present, such as residual gas from the environment.

According to a preferred development of the invention, the charged-particle source further comprises a gas ionizer device, said gas ionizer device being configured to irradiate energetic radiation into the source space, which energetic radiation is capable of ionizing particles of said gas, which is present in and/or fed into the source space, to obtain a plasma (wherein a weakly ionized plasma, i.e. having a degree of ionization of e.g. at least 1%, is sufficient), the particle source being operable in a second cleaning mode wherein a voltage is applied between selected ones of the adjustment electrodes while operating the gas ionizer device to generate a plasma in the gas within the source space and direct such plasma onto the emitter surface.

In other words, a cleaning method which corresponds to this second cleaning mode comprises
  regulating the pressure of gas within the source space, possibly including feeding a gas into the source space of the charged-particle source,
  irradiating energetic radiation (e.g. electrons) into the source space, preferably along a direction perpendicular to the direction of emission, which energetic radiation is capable of ionizing particles of said gas in the source space to obtain a plasma, and
  applying electrostatic potentials to adjustment electrodes located between the emitter electrode and the counter electrode, generating an electric field directing said plasma onto the emitter surface of the emitter electrode.

With the second cleaning mode another very efficient cleaning process in a charged-particle source is provided. The plasma is directed onto the emitter surface for removing material from the surface, for instance by sputtering and/or etching effects. Also in this cleaning mode the ionization of the gas species in the source space is decoupled from the primary beam radiation as produced by the emitter surface.

In particular, the energetic radiation may comprise electrons, and the gas ionizer device is an electron gun configured to inject said electrons into the source space, for instance in a direction transversal to the direction of emission. In a specific advantageous embodiment, the gas ionizer device may be realized as a hollow-cathode electron gun, configured to irradiate the energetic radiation (such as electrons) into the source space along a direction transversal to the direction of emission.

Furthermore, in many advantageous embodiments of the invention the pressure regulator device itself may feed the gas into the source space. Thus, the pressure regulator device may be able to feed, into the source space, one or more gas species destined to be ionized during an operation in the first cleaning mode (and, if applicable, the second cleaning mode as well), preferably and in particular while a voltage between the emitter and counter electrodes is applied during a cleaning mode operation. Alternatively or in combination, the pressure regulator device may be configured to supply at least one gas species into the source space at a pre-defined pressure of the gas species thus injected.

The number of adjustment electrodes which can be applied different electrostatic potentials with respect to the emitter electrode may be chosen suitably; i.e. typically this number lies between two and five, preferably four.

In order to further improve the cleaning processes and enable a better control of the locations to be cleaned, it may be advantageous when at least two of the adjustment electrodes are realized as split electrodes, each of said split electrodes being composed of at least two, preferably four, sectorial electrodes, which sectorial electrodes are configured to be applied different electrostatic potentials. In addition, these split electrodes may be used during a cleaning mode for directing ionized particles to specific regions on the emitter surface. Alternatively or in combination, the split electrodes may be configured to tune the intensity of ionized particles impinging on the emitter surface by means of the electrostatic potentials of the counter electrode and the adjustment electrodes including the split electrodes.

In order to achieve another improvement of the cleaning process, in particular a raised homogeneity, it may be useful to vary the voltages of the adjustment electrodes involved over time. This may be done in a step-wise manner, wherein for at each step a voltage of the adjustment electrodes is maintained for a respective duration. The voltage levels and pertinent durations are chosen suitably so as to achieve a desired profile of cleaning action.

The charged-particle source of the invention may further comprise a control electrode of Wehnelt type; this Wehnelt electrode would be located between the emitter electrode and the adjustment electrodes, preferably closer to the emitter electrode, said control electrode configured to being applied a control voltage with regard to the emitter electrode opposite to that of the counter electrode with regard to the emitter electrode, and having a control aperture at a location downstream of the emitter electrode along said direction of emission.

The charged-particle source of the invention is of particular benefit for use in a charged-particle multi-beam apparatus for processing or inspection of a target by means of exposure with a beam of electrically charged particles, comprising an illumination system including the charged-particle source according to the invention, a pattern definition device and a projection optics system.

BRIEF DESCRIPTION OF THE DRAWINGS

In the following, in order to further demonstrate the present invention, a discussion of illustrative and non-restrictive embodiments, as shown in the drawings, is presented. The drawings show:

FIG. 1 a charged-particle source according to a first preferred embodiment of the invention;

FIG. 1a a detail of the gas ionizer device of the source of FIG. 1;

FIG. 3 shows a pattern definition system of state of the art in a longitudinal section;

FIGS. 4a and 4b show one split electrode used in the charged-particle source of FIG. 1 in a perspective view (FIG. 4a) and a top view (FIG. 4b);

DETAILED DESCRIPTION OF EMBODIMENTS OF THE INVENTION

Figure 2:
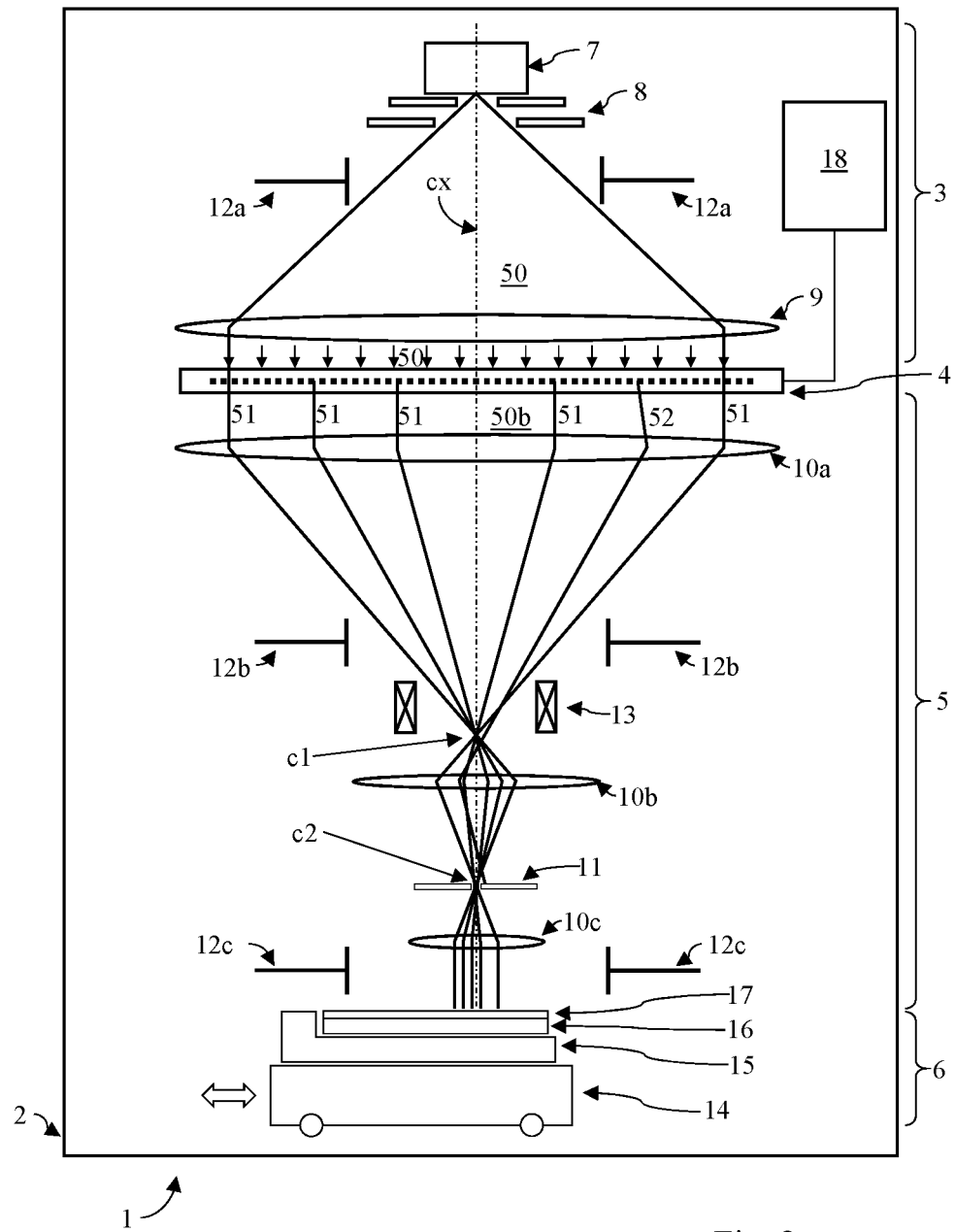
FIG. 2 shows a lithographic system of state of the art in a longitudinal sectional view in which the source of FIG. 1 can be suitably incorporated.

The detailed discussion of exemplary embodiments of the invention given below discloses the basic concepts and further advantageous developments of the invention. The embodiments refer to an electron source, but also elucidate methods using this source to generate charged particle beams with uniform current density and to condition the cathode surface by means of physical sputtering and/or chemical etching during a maintenance procedure. It will be evident to the person skilled in the art to freely combine several or all of the embodiments discussed here as deemed suitable for a specific application of the invention. Throughout this disclosure, terms like "for instance", "advantageous", "exemplary" or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the embodiments discussed in the following, which are given for exemplary, illustrative purpose and merely present suitable implementations of the invention.

The applicant has realized charged-particle multi-beam tools and developed corresponding charged-particle optics, pattern definition (PD) device, and multi-beam writing method, in particular a 50 keV electron multi-beam writer to realize leading-edge complex photomasks for 193 nm immersion lithography, of masks for EUV lithography and of templates (1× masks) for nanoimprint lithography. The system is called eMET (electron Mask Exposure Tool) or MBMW (multi-beam mask writer) for exposing 6" mask blank substrates. The multi-beam system has been called PML2 (Projection Mask-Less Lithography) for electron beam direct writer (EBDW) applications on Silicon wafer substrates. The multi-beam column and writing method can also be used for multi-beam inspection applications.

FIG. 1 shows a schematic representation of a charged particle source, more specifically an electron source, 100 according to one preferred embodiment of the invention in a longitudinal section along a central axis of the source, which coincides with the direction of emission e.

The electron source 100 comprises a cathode 101 having an emitter surface 111 which is configured for the emission of electrons along the mentioned direction of emission e, as well as a Wehnelt cylinder 102 and an anode 103 serving as counter electrode with an aperture 113 at the location where the direction of emission e passes through the anode. Suitable layouts of the cathode 101, Wehnelt 102 and aperture anode 103 are well-known to the skilled person. The source is located in a housing 120, which enables the source to be connected to the housing 2 of the apparatus 1, and which is connected to a vacuum pumping system 121 of its own, and/or is held at vacuum through the vacuum system of the apparatus 1. The electric potentials applied to the electrodes of the source 100 are provided by a voltage supply unit 157; the electric lines of the electrodes are generally understood and not shown for better clarity of the drawings.

Furthermore, in order to enable the in-situ cleaning according to the invention, the electron source 100 is provided with a pressure regulator device 104, also referred to as atmosphere regulator (AR), and several adjustment electrodes 106, 107, 108, 109; in addition, a device 105 for ionizing the gas, referred to as gas ionizer (GI) may be provided.

In the embodiment shown, the AR 104 includes a gas supply 140 for one or more gas species, one or more mass flow controllers (MFCs) 141, 142, a vacuum pumping system 143 (which preferably is separate from the vacuum pumping system 121), and a gas pressure sensor 144, and feeds the gases into the source chamber through a gas feed line 145 and the GI 105. The aperture 148 of the gas pressure sensor 144 in the source housing 120 (which is preferably well separated from the pumping connection of the vacuum pumping system 143 to the housing 120) is advantageously located such that it allows adequate measurement of the pressure in the source space 110, preferably in the region close to the emitter surface 111; for instance, the aperture 148 may be positioned just outside the source space 110 between the cathode 101 and next electrode in the source space, such as the first adjustment electrode 106. The MFCs 141, 142 control the amount of gases provided from the gas supply 140 to the source space. The AR 104 serves to regulate the pressure in the source space and inject, in a controlled manner, one or more gas species into the source chamber. Thus, the AR 104 enables introducing and regulating an atmosphere into the space of the charge-particle source between the anode and cathode. The gas supply 140 may provide specific gases supplied from resources such as gas bottles, and/or gases obtained from the surrounding, such as atmospheric gases (air). In other embodiments (not shown), the AR may not have a gas supply of its own, in which case the AR operates with atmospheric gases or residual gases from a preceding operation of the source, which gases are controlled at a desired pressure, for instance by means of the mentioned vacuum pumping system.

Referring to FIG. 1a, the GI 105 is configured to ionize the gas injected by the AR (via one or more MFCs 141 and the gas feed line 145), thus generating a plasma which can be accelerated by the electrodes of the source 100. For example, but not necessarily, the GI may be a hollow cathode electron gun additionally mounted in the source apparatus, with its orientation of the electrons emitted substantially perpendicularly to the axis e of the electron source. In the embodiment shown the GI 105 comprises a hollow cathode 151 and a ring anode 152, which are disposed at either end of an insulator tube 153; a plasma 154 resulting from the discharge within the tube 153 is allowed to leave the GI 105 through the opening 155 of the ring anode into the source space of the source chamber. The GI 105 further comprises a collector electrode 156 positioned at a location opposite to the opening 155 with respect to the axis e. The voltage of the collector electrode 156 is, e.g., about 500 V with respect to the ring anode 152, with its exact value being tunable to desired process parameters. The GI 105 is positioned such that the gases fed in through the GI 105 enter the source space 110 at a location at a distance from the cathode 101, for instance in the region between the adjustment electrodes, preferably between the two last adjustment electrodes 108 and 109.

Some or all of the MFCs 142 of the AR 104 (in particular in the case where the GI 105 is omitted) may be connected to the interior of the source bypassing the GI, for instance through an outlet 147. The one or more MFCs 142 of this "second" type may be used to supply gas in order to offer an additional adjustable flow of gas into the source space. The outlet 147 may be arranged at location convenient to ensure a suitable gas configuration in the source space 110, such as between two of the adjustment electrodes 106-109. In the embodiment shown, the outlet 147 is located before the electrodes where the GI 105 is positioned, more particularly between electrodes 107 and 108.

As mentioned, the charged-particle source 100 comprises a number of (in particular, at least two) adjustment electrodes 106, 107, 108, 109. The adjustment electrodes are, for instance, realized as conductive plates, separated by dielectric gaps. The electrodes of the source 100 are electrically connected to a voltage supply unit 112 which provides the electrostatic potentials needed for the individual electrodes; for the sake of clarity of the drawings the electric connecting lines from the voltage supply unit 112 to the plurality of electrodes in the source 100 are not shown.

Furthermore, in order to modify and/or control the trajectories of the different types of charged particles, some of the electrodes 106-109 are realized as split electrodes, which are composed of two or more sectorial sub-electrodes separated by dielectric gaps.

FIGS. 4a and 4b illustrate an exemplary layout of a split electrode 60 which is divided into four sub-electrodes 61, 62, 63, 64. The sub-electrodes of one respective split electrode are, preferably, plates of same sector-like shape while being located at different azimuthal ranges within the same axial position with regard to the axis e. The sub-electrodes 61-64 combine into an overall ring-shaped split electrode 60, joined by isolating gap spacers 65 made of a suitable dielectric material. Thus, the split electrodes allow the implementation of a 'multipole' mode, in addition to a 'monopole' regime. A monopole regime is here defined as the condition in which all the plates of one electrode share the same electrical potential, whereas in a multipole regime the plates will generally be applied different electrical potentials. The sub-electrodes are connected to the voltage supply so they can be electrically biased with individual electrostatic potentials; where appropriate they may be biased in couples or to a common electrical potential. The number of plates that compose a split electrode may vary as appropriate with regard to the requirements imposed on the source 100 and the processing apparatus 1; typical suitable values are two to eight. It is emphasized that the voltage supply unit 112 is a high voltage source designed such that it can apply different electric biases at the various sub-electrodes 61-64 of the split electrodes 106-109, the cathode/anode 101, 103 and the Wehnelt cylinder 102. Thus, the split electrodes 106-109 are capable of operating as more complex entities which, in general, can generate electrical fields not following a rotational symmetry respect to the axis e, such as quadrupole lenses or electrostatic deflectors.

In the embodiment shown, the electrodes are substantially ring-shaped; in other realizations, the shape of the electrodes may be more complex. Examples of suitable dimensions are as follows: The inner radius of the adjustment electrodes may be within a range from 0.5 mm up to 1.0 mm. The physical dimensions of each electrode along the axis e is chosen within a range from 0.5 mm to 3 mm. The spacing between electrodes is set at a value between 1 mm up to 2 mm. The dimensions may be the same for all electrodes or vary for each electrode. Depending on the number of electrodes and dimension of the electrodes, the length of the overall source space may range from 4 mm to 37 mm. The sub-electrodes are preferentially composed by a conductive material such as titanium, molybdenum or 316L stainless steel, whereas the dielectrics gaps are in a range from 0.1 mm to 0.5 mm; the dielectrics gaps may be realized as ("empty") spaces or be filled with machined Macor, Al2O3 or other ceramics.

In the following various operating conditions (also referred to as 'operation modes') of the electron source 100 are described. An operation mode is generally specified by parameters including: the average pressure and atmosphere composition in the source, the electrical potential applied to individual components of the source. Unless explicitly specified otherwise, voltage values of electrodes are understood as potential differences with respect to the potential of the anode 103 serving as counter electrode; this potential is also referred to as ground potential. The term "bias" of a component is understood in this sense as referring to an electric potential applied to the respective component relative to the anode.

Figure 5:
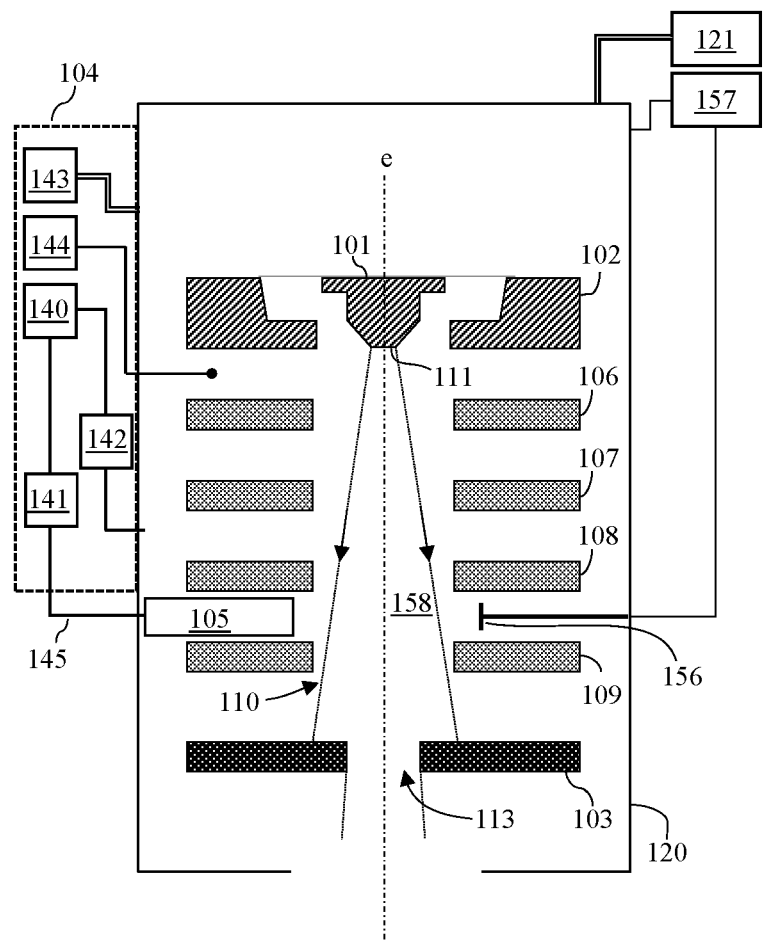
FIG. 5 illustrates operation of the source of FIG. 1 according to an emission mode to emit a charged-particle beam.

FIG. 5 illustrates one main operation mode of the source 100, called 'emission mode'. In this mode, the source generates wide electron radiation which comes out from the emitter surface 111 of the cathode 101 with a given kinetic energy (as defined by the voltage between cathode and anode) and moving along the direction of emission e. Here, a high negative bias is supplied to the cathode 101 by the power supply unit 157. More specifically, in accordance with general state of the art, electron radiation 158 is generated at the cathode 101 by means of thermionic emission, field emission or related mechanisms exploiting the Shottky-effect, and focused through the Wehnelt cylinder 102. Typical values of the acceleration voltage at which the cathode is biased are in the range from 0.1 to 50 kV. In addition, the split electrodes 106-109 are biased relative to the cathode in order to provide the extraction potential for the negatively charged electrons, adjust the beam kinetic energy to the desired value, provide additional collimation and finally direct the electrons towards the aperture. The split electrodes are operated as monopoles in this operation mode. The aperture 113 of the counter electrode 103 cuts off the undesired part of the radiation 158. The emission mode can be used, for example, during processing in an electron multi-beam processing apparatus. During emission mode only negatively charged particles, namely electrons, are intentionally generated in this embodiment of the source according to the invention. The chamber is kept at a constant pressure of around $1.0 \cdot 10^{-7}$ Pa by the atmosphere regulator unit.

Figure 6:
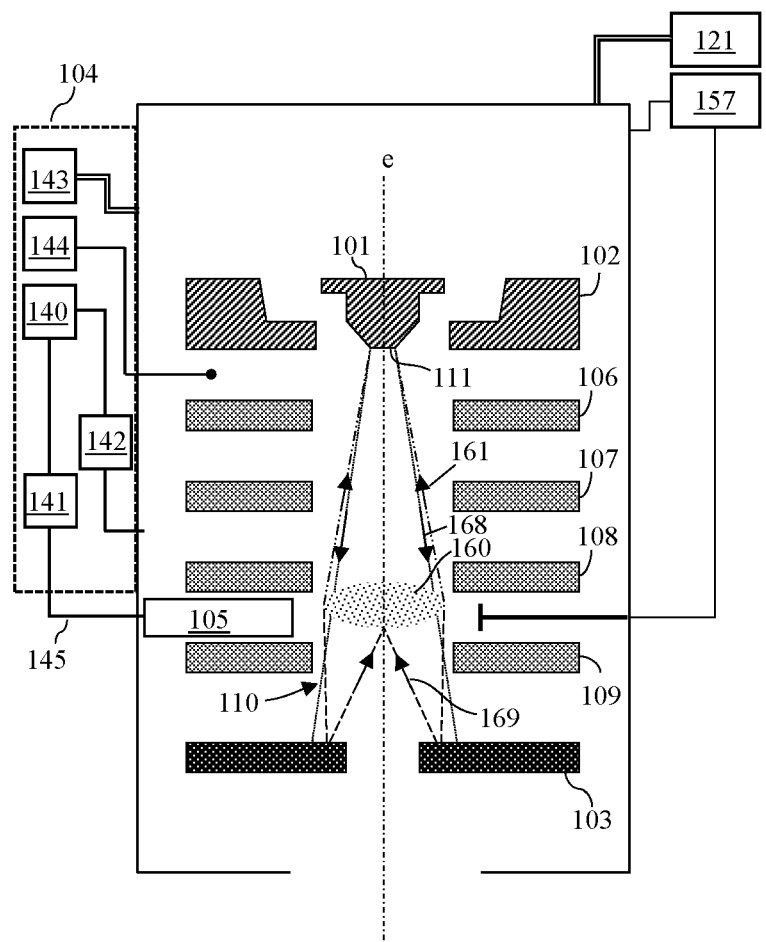
FIG. 6 illustrates operation of the source of FIG. 1 according to a first cleaning mode.

FIG. 6 illustrates another operation mode, which is herein referred to as first cleaning mode or also 'soft cleaning mode'. This mode is operated to generate and direct towards the cathode positively charged ion particles generated by controlled interaction with the radiation emitted by the cathode. A gas of specific chemistry is introduced in the chamber through the AR 104, meanwhile the pressure in the chamber is kept at a pre-determined value, for example, at a value around $8.0 \cdot 10^{-4}$ Pa. The gas chemistry may be composed of a single gas species, such as argon (Ar), or of two or more gas species such as Ar and fluorine (F), depending on the type of treatment required on the emitter surface 111 of the cathode 101. For instance, fluorine may be supplied in the form of a suitable precursor such as sulfur hexafluoride ($SF_6$); depending on the cleaning process needed, other suitable gas species such as xenon (Xe) may be used, or a gas mixture, such as a hydrogen/nitrogen mixture (forming gas). Two of the split electrodes, for instance the electrodes 108 and 109 farthest from the cathode 101 and Wehnelt 102, operate in monopole mode and, as such, define the main ionization area of the gas mixture and give the conditions for charge separation. As an example, the electrodes 108 and 109 can be operated, in general, within a range between zero (i.e., ground potential) and the modulus (i.e., absolute value) of the potential of the cathode 101. Furthermore, the electrodes 106, 107 provide the function of extraction of the radiation from the cathode and shaping of the charged particles traveling toward the cathode. Thus, in a typical scenario 106 is at ground potential (i.e., that of electrode 103) and the electrode 107 may be operated at a potential chosen in the range spanning from minus to plus modulus of the potential of the cathode 101. Further examples are given below in relation to FIGS. 10-12.

It will be evident to those skilled in the art that the width and the position of the main ionization area relative to the split electrode plates can be adjusted by varying the biases applied to the split electrodes themselves. Here the cathode, biased as described in the emission mode, will radiate electrons 168 which partially ionize the gas mixture introduced in the source chamber in a region around the axis e, referred to as ionization area and indicated in the drawings as a dot-hatched area 160. Nevertheless, the ionization rate of the gas mixture molecules—as caused by the electrons 168, which are travelling substantially along the direction of emission e,—is rather low due to the high energy of the electrons (e.g. 5 keV) (for an explanation, see e.g. Kim & Rudd op.cit.). Thus, the gas mixture ionization rate in the ionization area 160 can be enhanced via secondary electrons 169 emitted from the source components (e.g. electrodes and other metal parts) if the latter are hit by the beam of primary electrons 168 coming from the cathode. Thus, the remaining split electrodes can operate in multipole mode, e.g. forming a basic quadrupole electrostatic lens or electrostatic dipoles in order to shape and direct the electron radiation so that it hits in a predefined position the inner wall of the source chamber generating secondary electrons and enhancing the ionization rate. The ionization area and the secondary electrons source position are defined so that ionized gas mixture molecules 161 will be accelerated back to the emitter surface 111 of the cathode 101 along the axis e. Advantageously, one or several of the split electrodes 106-109 can be electrostatically biased in monopole mode to act as additional focusing elements for the ions travelling towards the source and as such modify the ion landing distribution.

An example of a soft cleaning mode is as follows: The cathode 101 is set to −5 kV with respect to the counter electrode 103, and the electrodes 108 and 109 are set to ground potential and +2.5 kV, respectively, in order to define the main gas ionization area 160 in the space between the positions of electrodes 108 and 109. Then, the electrode 106 is set to ground potential, and the electrode 107 can be used as focusing/defocusing electrode for the charged particles 161 moving towards the emitter surface 111 along the axis e.

Figure 10:
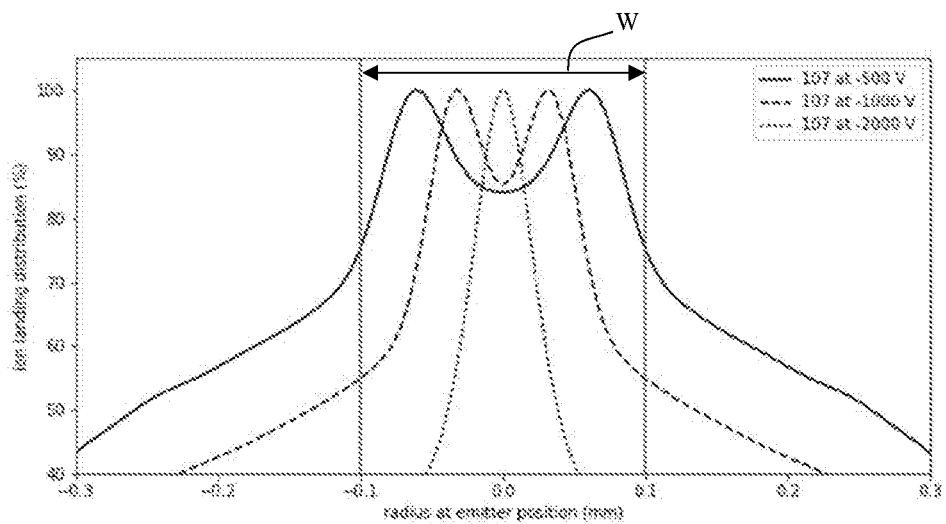
FIG. 10 shows ion landing distributions at the emitter surface for different voltages applied to the adjustment electrodes.

FIG. 10 depicts landing (density) distributions of the ions at the emitter surface position along the axis e as a function of the cathode radius (distance from the axis e) for three different values of the voltage of the second split electrode 107 as specified in the insert of FIG. 10; the landing distributions shown are results obtained from numerical simulations, normalized to the maximum value of the respective landing distribution. The positional range of the emitter surface 111 is denoted by the double arrow W. It is clear from FIG. 10 that, when the voltage applied to electrode 107 is varied from −0.5 kV to −2 kV, the ion landing (density) distribution and thus the intensity of the ion treatment goes from a distribution which is high at the border of the emitter surface towards a distribution peaked in the center. This demonstrates that the voltage of the adjustment electrodes enables to adjust the location of an ion treatment such that it can be applied to periphery, mid radius and center of the emitter surface. The ions generated are, by virtue of their positive electric charge, directed towards the cathode by the electric potential difference between the split electrodes.

By means of sputtering and or chemical etching, the impinging ions clean the surface of the cathode. The soft cleaning mode is advantageous in applications where the source is part of, for example, an electron multi-beam processing apparatus, and may be used as a conditioning procedure or during maintenance of the latter. The overall low ion density in the chamber leads to a slow sputtering rate of less than 1 A/s. Such slow sputter rate is advantageously adopted, e.g., in a case where a regeneration of the cathode is needed, but a large erosion of the latter is not desired, thus necessitating fine control of the sputtering procedure.

Figure 11:
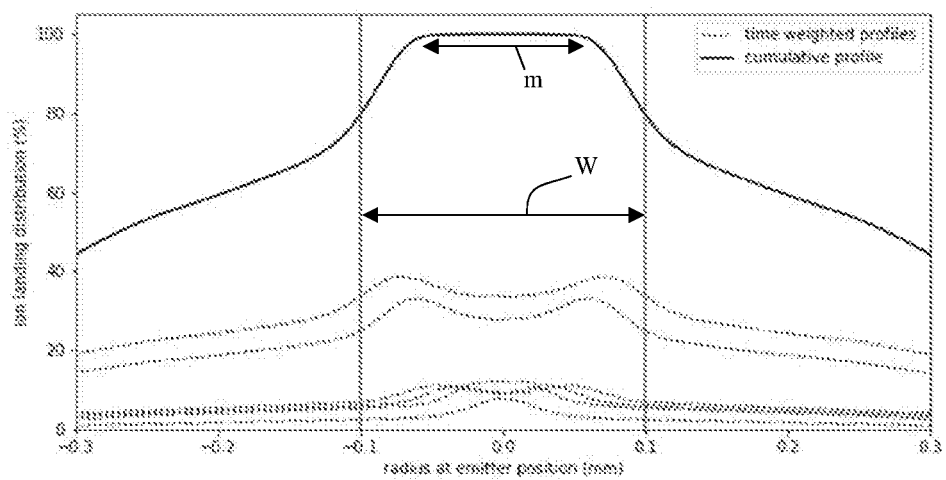
FIG. 11 shows ion landing distributions at the emitter surface generated by time-dependent application of different voltages.

In a further variant, and with reference to FIG. 11, the cleaning method may be further improved by varying the voltage of the adjustment electrodes step-wise over time, choosing the time steps suitably so that the generated electric field can be considered as static for all the charged particle present in the source space within the said time step. Such step-wise variation of the voltage over time allows provides for homogenizing the effect of cleaning across the emitter area, by averaging out the varying local intensity of each individual fixed voltage setting.

FIG. 11 shows a number of time-weighted ion landing profiles (dotted curves), which were obtained using six different electric potential configurations applied at electrode 107 (i.e. 0.25 kV, 0.5 kV, 0.75 kV, 1.00 kV, 1.25 kV, 1.75 kV) for varying durations, namely, 350 s, 300 s, 100 s, 100 s, 110 s, 75 s, respectively, as well as a cumulative ion landing profile (solid curve) corresponding to the sum of the time-weighted profiles. In all profiles, the cathode 101 is set to −5 kV with respect to the counter electrode 103, the electrode 109 is set to +2.5 kV, and electrodes 106, 107, 108 are fixed to ground potential. The vertical scale of the profile curves is normalized to the maximum of the cumulative profile. As can be seen easily from FIG. 11 the cumulative profile attains a plateau-like maximum m over a large portion of the emitter surface (indicated by double arrow W). A treatment of the kind illustrated in FIG. 11 will lead to an erosion of the crystal surface of maximum 100 nm, taking into account a maximum sputtering rate of 1 A/s. Thus, in this example, within 1035 s, i.e., approx. 17 minutes, of treatment the first contaminated layer is cleaned/removed without large erosion of the bulk of the crystal.

Figure 7:
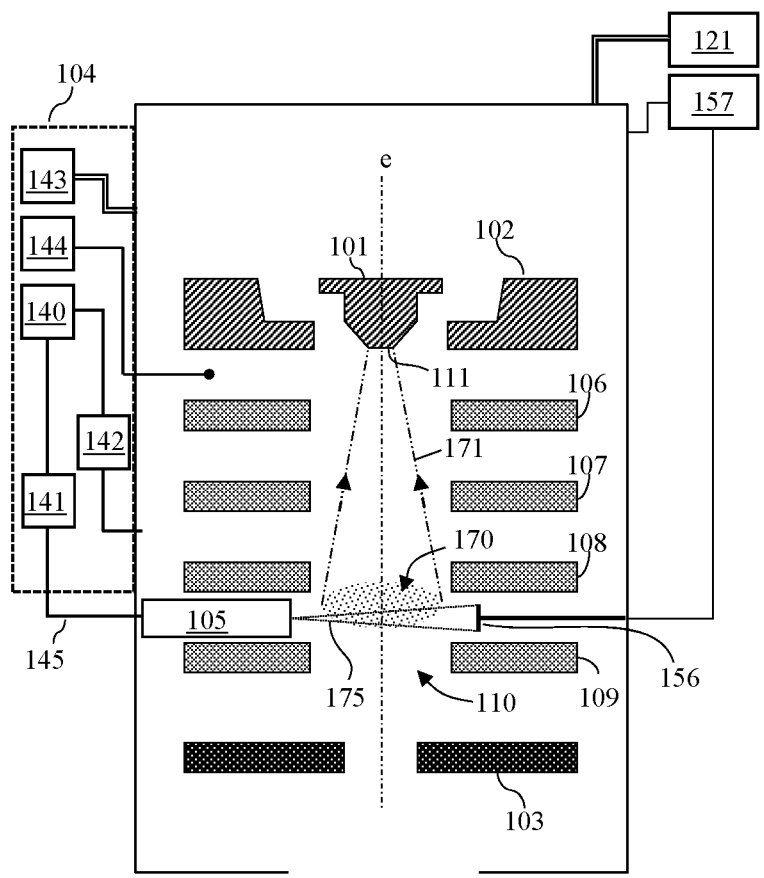
FIG. 7 illustrates operation of the source of FIG. 1 according to a second cleaning mode.

FIG. 7 illustrates a further operation mode, which herein is referred to as second cleaning mode or also 'hard cleaning mode'. A controlled flow of gas 175 formed of argon (Ar) or another suitable mixture of gasses is introduced into the chamber by the AR 104 as described above in the context of the first cleaning mode. In this mode, the cathode 101 emits no radiation and the applied electrostatic bias is chosen such as to attract positive charged particles moving parallel to the optical axis of the source to the cathode. The overall configuration is similar to the first cleaning mode, with the main difference being that the gas 175 is solely ionized by means of the GI 105, rather than by secondary electron emission or radiation emitted from the cathode. Electrons are emitted by the GI 105 towards the collector electrode 156 so as to cross a region around the axis e, referred to as the ionization area and indicated in the drawings as a dot-hatched area 150, along paths substantially perpendicularly to the axis e of the source. The electrons thus ionizing the Ar molecules to form an ion flux 171 towards the emitter surface 111. Thus, since the electrons are used for ionization of the ions only, the split electrodes will influence the trajectory of only the latter type of particles, i.e. the ions used for 'hard cleaning'. The ionizing current ($I_e$) and the ionizing energy ($E_i$) emitted by the GI can be adjusted in order to maximize the ionization rate of gas molecules according to methods known in the state of art, e.g. see Kim & Rudd op.cit. In general, the ion density is adjusted to obtain a sputtering rate which is up to 10-20 times higher than that in the soft cleaning mode. Further details of how to adjust $I_e/E_i$ and sputtering rate are not included here as part of common knowledge to those skilled in the art and not part of this invention.

Figure 8:
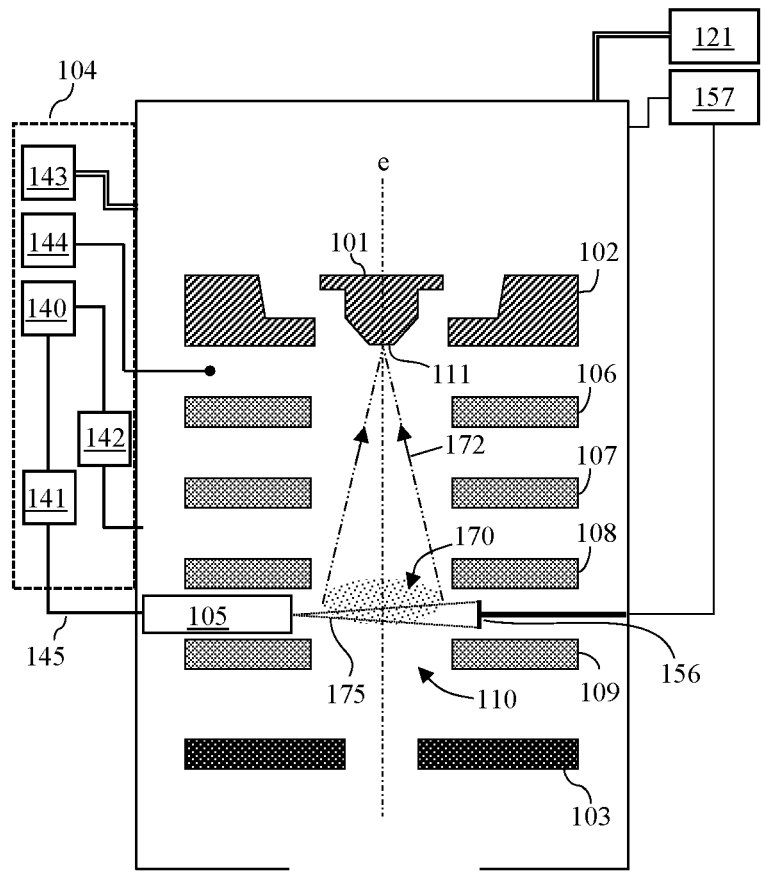
FIG. 8 illustrates a variant of the second cleaning mode with focusing the ions onto the emitter surface of the source.
Figure 9:
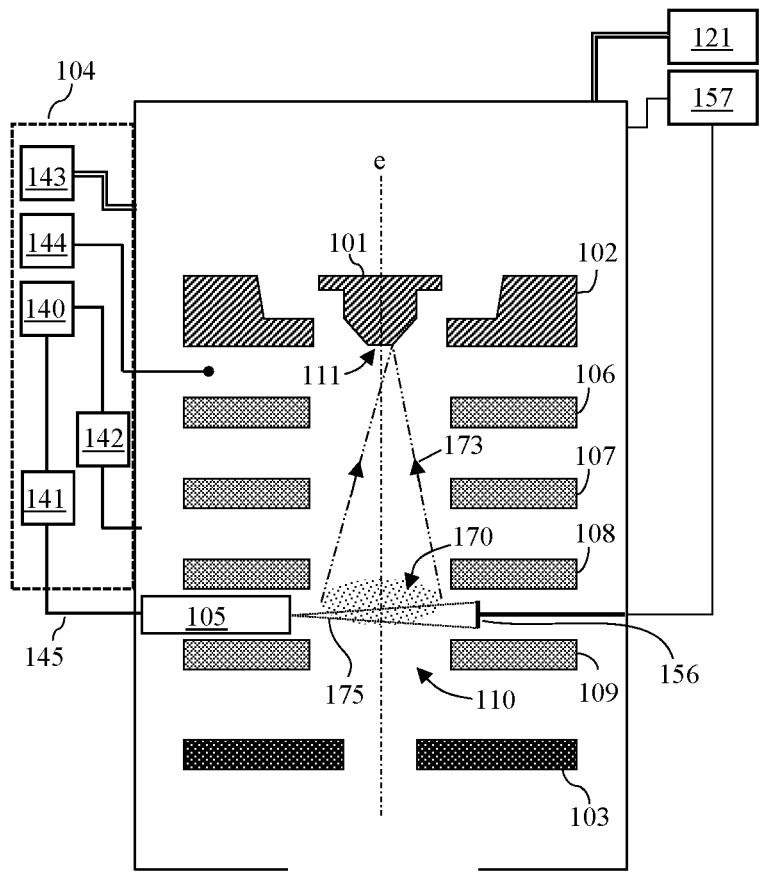
FIG. 9 illustrates a variant of the second cleaning mode with deflecting the ions over the emitter surface of the source.

While the ions are the only charged particles moving along the direction of emission e in this mode as mentioned, the split electrodes 106-109 may be used to act as lensing apparatus, with the individual electrostatic potentials being chosen in suitable way which allows to direct the ions towards specific desired locations on the emitter surface. This is depicted in FIGS. 8 and 9. The ions 172 generated in the ionization area are accelerated and will travel along the axis e, and they can be focused and defocused on the cathode surface in order to reach a desired sputtering homogeneity, between a flat distribution as shown in FIG. 7 or a focused spot as shown in FIG. 8. Alternatively or in combination, as depicted in FIG. 9, it is possible to deflect the ions from their path along the axis e in order to localize the sputtering operation on a specific particular region of the emitter surface; this is achieved by operating the split electrodes 106, 107 in multipole mode.

Figure 12:
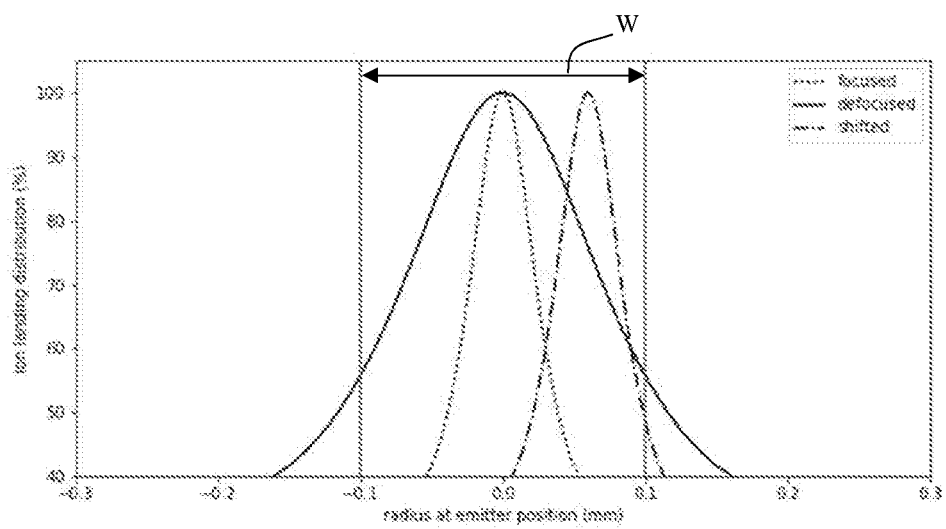
FIG. 12 shows ion landing distributions at the emitter surface for different focusing states with an adjustment electrode voltage of −2000 V.

FIG. 12 illustrates focusing and shifting of the sputtering spot on the emitter surface 111, whose location is again indicated by the double arrow W. Three exemplary ion landing distributions are shown, which have been obtained by means of numerical simulations considering a cloud of ions starting within the ionization area (cf. FIGS. 8 and 9) and accelerated toward 101 along the axis e; each curve is normalized to the respective maximum value. In this scenario the cathode 101 is biased at −5 kV with respect to the counter electrode 103, but in contrast to the soft cleaning mode the cathode 101 acts as cold cathode (i.e. no charged particle emission). To the split electrodes 109 and 108 is applied the same potential as during the soft sputtering procedure. The three curves shown in FIG. 12 correspond to the following potential configurations applied to the split electrodes 106 and 107 (also here, voltages are with respect to the ground potential of the counter electrode 103):

For focused beam (dotted curve): as in the soft cleaning mode the split electrode 106 is at ground potential 0 kV, and a potential of −2 kV is applied to the split electrode 107. To obtain this configuration the sub-electrodes of the split electrodes 106 and 107 share the same potential (as in monopole mode).

Figure 13A:
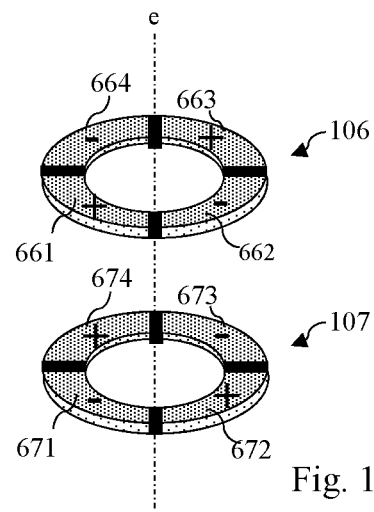
FIG. 13a illustrates a quadrupole configuration of the sub-electrodes during a second cleaning mode operation with defocused beam.

For defocused beam (full curve): as in the soft cleaning mode the split electrode 106 is at ground potential 0 kV, and a potential of −2 kV is applied to the split electrode 107. In this mode an additional quadrupole field is generated by means of the sub-electrodes 661-664 and 671-674 of the electrodes 106 and 107, respectively. This is illustrated in FIG. 13a, where the plus and minus signs symbolize the voltages applied to realize quadrupole fields, superposed to the overall potentials (0 kV/−2 kV) of each electrode 106, 107, of the order of 10 to 20 V (typical values, suitably chosen depending on the amount of defocus needed). The quadrupole field configuration applied to electrode 106 is rotated by 90° with respect to electrode 107. In other words, an ion-optical correction as described in "Ion optics with electrostatic lenses", section 8.1, by F. Hinterberg is applied.

Figure 13B:
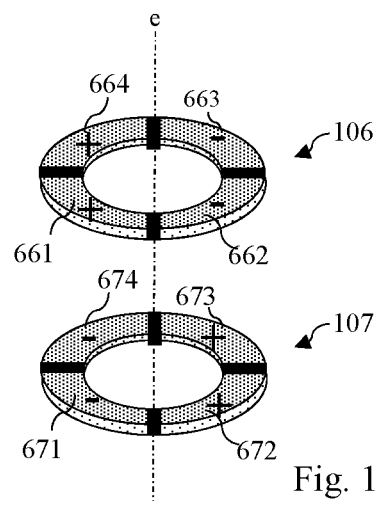
FIG. 13b illustrates a dipole field configuration of the sub-electrodes during a second cleaning mode operation to achieve a lateral shift of the beam.

For shifted beam (dash-dotted curve): as in the soft cleaning mode the split electrode 106 is at ground potential 0 kV, and a potential of −2 kV is applied to the split electrode 107. In this mode an additional dipole field is applied through the sub-electrodes 661-664 and 671-674 of the electrodes 106 and 107, respectively. The electrostatic potential difference between poles (where poles are meant to indicate the plates pairs 661, 664 and 662, 663; and 671, 0674 and 672, 673 in FIG. 13b) is of the order of 10 to 20 V (typical values, conveniently chosen depending on the amount of shift needed), superposed to the overall potentials (0 kV/−2 kV) of each electrode 106, 107. The dipole field configuration applied to electrode 106 is rotated by 180° with respect to electrode 107.

It will be evident to the skilled person that the voltage configurations of the electrodes and their sub-electrodes can be varied to achieve further suitable configurations of cleaning operations at the emitter surface 111.

What is claimed is:

1. A charged-particle source configured for emission of electrically charged particles as a charged-particle beam along a direction of emission,
said charged-particle source comprising
a housing connectable to a vacuum system, allowing the charged-particle source being operated at a high vacuum,
an emitter electrode, having an emitter surface configured to emit charged particles of a specific particle species along the direction of emission,
a counter electrode configured to have an electrostatic voltage applied with respect to the emitter electrode at a sign opposite to that of the electrically charged particles, the counter electrode having an emitter aperture at a location downstream of the emitter surface along said direction of emission,
a source space defined between the emitter surface and the emitter aperture,
at least two adjustment electrodes, located surrounding the source space between the emitter electrode and the counter electrode, each adjustment electrode being configured to have a controlled electrostatic voltage applied with respect to the counter and/or emitter electrodes, and
a pressure regulator device, said pressure regulator device controls the pressure of a gas present in the source space, wherein the pressure regulator device is configured to feed, into the source space, one or more gas species destined to be ionized during an operation in the first cleaning mode, while a voltage between the emitter and counter electrodes is applied,
the particle source being operable in an emission mode wherein a voltage is applied between the emitter and counter electrodes, causing generation of charged particles leaving the particle source along the direction of emission,
the particle source being further operable in a first cleaning mode wherein
the gas is held at a pre-defined pressure value within the source space, while applying a voltage between the emitter and counter electrodes, wherein secondary electrons generated by charged particles at the counter electrode ionize particles of said gas in the source space, producing ionized gas particles and electrostatic potentials are applied to at least some of the adjustment electrodes, generating an electric field directing said ionized gas particles onto the emitter surface.

2. The charged-particle source of claim 1, further comprising a gas ionizer device, said gas ionizer device being configured to irradiate energetic radiation into the source space, which energetic radiation is capable of ionizing particles of said gas present in or fed into the source space to obtain a plasma, the particle source being operable in a second cleaning mode wherein the gas ionizer device is operated to generate a plasma in the gas within the source space, while applying a voltage between selected ones of the adjustment electrodes so as to direct said plasma onto the emitter surface.

3. The charged-particle source of claim 2, wherein the energetic radiation comprises electrons, and the gas ionizer device is an electron gun configured to inject said electrons into the source space.

4. The charged-particle source of claim 2, wherein the gas ionizer device is a hollow-cathode electron gun, configured to irradiate the energetic radiation into the source space along a direction transversal to the direction of emission.

5. The charged-particle source of claim 1, wherein the number of adjustment electrodes which can be applied different electrostatic potentials with respect to the emitter electrode is at least two.

6. The charged-particle source of claim 1, wherein at least two of the adjustment electrodes are realized as split electrodes, each of said split electrodes being composed of at least two sectorial electrodes, which sectorial electrodes are configured to be applied different electrostatic potentials.

7. The charged-particle source of claim 6, configured to use said split electrodes during a cleaning mode for directing ionized particles to specific regions on the emitter surface.

8. The charged-particle source of claim 6, configured to tune the intensity of ionized particles impinging on the emitter surface by means of the electrostatic potentials of the counter electrode and the adjustment electrodes including the split electrodes.

9. The charged-particle source of claim 1, further comprising a control electrode of Wehnelt type located between the emitter electrode and the adjustment electrodes said control electrode configured to being applied a control voltage with regard to the emitter electrode opposite to that of the counter electrode with regard to the emitter electrode, and having a control aperture at a location downstream of the emitter electrode along said direction of emission.

10. Charged-particle multi-beam apparatus for processing or inspection of a target by means of exposure with a beam of electrically charged particles, comprising:

an illumination system, wherein the illumination system comprises a housing connectable to a vacuum system, allowing the charged-particle source being operated at a high vacuum, an emitter electrode, having an emitter surface configured to emit charged particles of a specific particle species along the direction of emission, a counter electrode configured to have an electrostatic voltage applied with respect to the emitter electrode at a sign opposite to that of the electrically charged particles, the counter electrode having an emitter aperture at a location downstream of the emitter surface along said direction of emission, a source space defined between the emitter surface and the emitter aperture, at least two adjustment electrodes, located surrounding the source space between the emitter electrode and the counter electrode, each adjustment electrode being configured to have a controlled electrostatic voltage applied with respect to the counter and/or emitter electrodes, and a pressure regulator device, said pressure regulator device controls the pressure of a gas present in the source space, wherein the pressure regulator device is configured to feed, into the source space, one or more gas species destined to be ionized during an operation in the first cleaning mode, while a voltage between the emitter and counter electrodes is applied, the particle source being operable in an emission mode wherein a voltage is applied between the emitter and counter electrodes, causing generation of charged particles leaving the particle source along the direction of emission, the particle source being further operable in a first cleaning mode wherein the gas is held at a pre-defined pressure value within the source space, while applying a voltage between the emitter and counter electrodes, wherein secondary electrons generated by charged particles at the counter electrode ionize particles of said gas in the source space, producing ionized gas particles and electrostatic potentials are applied to at least some of the adjustment electrodes, generating an electric field directing said ionized gas particles onto the emitter surfac-e a pattern definition device; and a projection optics system.

11. A method for in-situ cleaning of an emitter electrode of a charged-particle source configured for emission of electrically charged particles along a direction of emission by applying a voltage between the emitter electrode and a counter electrode, the method comprising regulating the pressure of gas within the source space located between the emitter and counter electrodes, and applying a voltage between the emitter and counter electrodes, wherein secondary electrons generated by charged particles at said counter electrode ionize particles of said gas in the source space, producing ionized gas particles, and applying electrostatic potentials to adjustment electrodes located between the emitter surface and the counter electrode, generating an electric field directing said ionized gas particles onto the emitter surface.

12. A method for in-situ cleaning of an emitter electrode of a charged-particle source, the method comprising regulating the pressure of gas within a source space of the charged-particle source, irradiating energetic radiation into the source space along a direction transversal to a direction of emission of the charged-particle source, which energetic radiation is capable of ionizing particles of said gas in the source space to obtain a plasma, and applying electrostatic potentials to adjustment electrodes located between the emitter electrode and a counter electrode of said emitter electrode, generating an electric field directing said plasma onto an emitter surface of said emitter electrode.

13. The method of claim 11, wherein at least two adjustment electrodes are provided in the space between the emitter and counter electrodes, each of said adjustment electrodes being realized as split electrodes, each of which is composed of at least two, preferably four, sectorial electrodes, which sectorial electrodes are applied different electrostatic potentials, for directing ionized particles to specific regions on the emitter surface.

14. The method of claim 11, wherein the voltages of the adjustment electrodes involved are varied over time in a step-wise manner, wherein for at each step a voltage of the adjustment electrodes is maintained for a respective duration.

15. The charged-particle source of claim 1, wherein the electrically charged particles are electrons.

16. The method of claim 11, wherein the electrically charged particles are electrons.

17. The charged-particle source of claim 1, wherein the number of adjustment electrodes which can be applied different electrostatic potentials with respect to the emitter electrode is up to five.

18. The charged-particle source of claim 1, wherein the number of adjustment electrodes which can be applied different electrostatic potentials with respect to the emitter electrode is four.

19. The charged-particle source of claim 1, wherein at least two of the adjustment electrodes are realized as split electrodes, each of said split electrodes being composed of four sectorial electrodes, which sectorial electrodes are configured to be applied different electrostatic potentials.

20. The charged-particle source of claim 1, further comprising
a control electrode of Wehnelt type located between the emitter electrode and the adjustment electrodes, wherein the control electrode is closer to the emitter electrode, said control electrode configured to being applied a control voltage with regard to the emitter electrode opposite to that of the counter electrode with regard to the emitter electrode, and having a control aperture at a location downstream of the emitter electrode along said direction of emission.

21. The charged-particle source of claim 2, wherein the energetic radiation comprises electrons, and the gas ionizer device is an electron gun configured to inject said electrons into the source space in a direction transversal to the direction of emission.

22. A charged-particle source configured for emission of electrically charged particles as a charged-particle beam along a direction of emission, said charged-particle source comprising a housing connectable to a vacuum system, allowing the charged-particle source being operated at a high vacuum,
an emitter electrode, having an emitter surface configured to emit charged particles of a specific particle species along the direction of emission,
a counter electrode configured to have an electrostatic voltage applied with respect to the emitter electrode at a sign opposite to that of the electrically charged particles, the counter electrode having an emitter aperture at a location downstream of the emitter surface along said direction of emission,
a source space defined between the emitter surface and the emitter aperture,
at least two adjustment electrodes, located surrounding the source space between the emitter electrode and the counter electrode, each adjustment electrode being configured to have a controlled electrostatic voltage applied with respect to the counter and/or emitter electrodes, and
a pressure regulator device, said pressure regulator device controls the pressure of a gas present in the source space,
the particle source being operable in an emission mode wherein a voltage is applied between the emitter and counter electrodes, causing generation of charged particles leaving the particle source along the direction of emission, the particle source being further operable in a first cleaning mode wherein
the gas is held at a pre-defined pressure value within the source space, while applying a voltage between the emitter and counter electrodes, wherein secondary electrons generated by charged particles at the counter electrode ionize particles of said gas in the source space, producing ionized gas particles and
electrostatic potentials are applied to at least some of the adjustment electrodes, generating an electric field directing said ionized gas particles onto the emitter surface
and wherein the charged-particle source further comprises a gas ionizer device, said gas ionizer device being configured to irradiate energetic radiation into the source space, which energetic radiation is capable of ionizing particles of said gas present in or fed into the source space to obtain a plasma,
the particle source being operable in a second cleaning mode wherein the gas ionizer device is operated to generate a plasma in the gas within the source space, while applying a voltage between selected ones of the adjustment electrodes so as to direct said plasma onto the emitter surface.

* * * * *